US012176012B2

(12) United States Patent
Ogaki

(10) Patent No.: US 12,176,012 B2
(45) Date of Patent: Dec. 24, 2024

(54) MANUFACTURING METHOD OF DISK-DRIVE SUSPENSION AND MANUFACTURING APPARATUS OF DISK-DRIVE SUSPENSION

(71) Applicant: NHK SPRING CO., LTD., Yokohama (JP)

(72) Inventor: Shogo Ogaki, Yokohama (JP)

(73) Assignee: NHK SPRING CO., LTD., Kanagawa (JP)

( * ) Notice: Subject to any disclaimer, the term of this patent is extended or adjusted under 35 U.S.C. 154(b) by 438 days.

(21) Appl. No.: 17/488,152

(22) Filed: Sep. 28, 2021

(65) Prior Publication Data

US 2022/0101876 A1 Mar. 31, 2022

(30) Foreign Application Priority Data

Sep. 29, 2020 (JP) ................................. 2020-162864

(51) Int. Cl.
*G11B 5/48* (2006.01)
*H10N 30/073* (2023.01)

(52) U.S. Cl.
CPC ........... *G11B 5/484* (2013.01); *H10N 30/073* (2023.02)

(58) Field of Classification Search
CPC ....... G11B 5/483; G11B 5/484; H10N 30/073
See application file for complete search history.

(56) References Cited

U.S. PATENT DOCUMENTS

| 6,647,621 | B1* | 11/2003 | Roen ........................ H05K 3/44 |
| | | | 29/877 |
| 6,724,580 | B2 | 4/2004 | Irie et al. |
| 6,731,472 | B2 | 5/2004 | Okamoto et al. |
| 7,181,825 | B2 | 2/2007 | Yao et al. |
| 7,501,737 | B2 | 3/2009 | Yao et al. |
| 8,405,934 | B2 | 3/2013 | Fuchino |
| 8,630,067 | B2 | 1/2014 | Ando et al. |
| 8,964,335 | B2 | 2/2015 | Ando et al. |
| 10,189,232 | B1* | 1/2019 | Shimoda ................ B29C 65/10 |
| 10,684,501 | B2 | 6/2020 | Tashima et al. |

(Continued)

FOREIGN PATENT DOCUMENTS

| CN | 1318837 A | 10/2001 |
| CN | 1441417 A | 9/2003 |

(Continued)

OTHER PUBLICATIONS

Chinese Office Action (and an English language translation thereof) dated May 24, 2023, issued in counterpart Chinese Application No. 202111124413.7.

(Continued)

*Primary Examiner* — Daniel Mcnally
(74) *Attorney, Agent, or Firm* — Holtz, Holtz & Volek PC

(57) ABSTRACT

An adhesive reactive to ultraviolet rays is applied to an actuator mounting portion of a suspension. An electrical conducting material is applied to a conductor and the like of the actuator mounting portion. When the adhesive is irradiated with ultraviolet rays, the viscosity of the adhesive is increased. A piezoelectric element is placed on the adhesive the viscosity of which is increased. Thereafter, the adhesive and the electrical conducting material are heated, whereby the adhesive and the electrical conducting material are cured.

5 Claims, 11 Drawing Sheets

(56) References Cited

U.S. PATENT DOCUMENTS

| | | |
|---|---|---|
| 2009/0199380 A1 | 8/2009 | Yao et al. |
| 2011/0079351 A1 | 4/2011 | Furuta |
| 2013/0294211 A1 | 11/2013 | Furuichi et al. |

FOREIGN PATENT DOCUMENTS

| | | | | | |
|---|---|---|---|---|---|
| CN | 1448919 | A | | 10/2003 | |
| CN | 1771536 | A | | 5/2006 | |
| CN | 101714359 | A | * | 5/2010 | ........... G11B 5/4826 |
| CN | 103390413 | A | | 11/2013 | |
| CN | 108663831 | A | | 10/2018 | |
| JP | 2001035020 | A | | 2/2001 | |
| JP | 2002050140 | A | | 2/2002 | |
| JP | 2010108589 | A | | 5/2010 | |
| JP | 2011070740 | A | | 4/2011 | |
| JP | 2011216160 | A | | 10/2011 | |
| JP | 2012133848 | A | | 7/2012 | |
| JP | 2017191914 | A | | 10/2017 | |
| JP | 2019163412 | A | | 9/2019 | |

OTHER PUBLICATIONS

Japanese Office Action (and an English language translation thereof) dated Jan. 30, 2024, issued in counterpart Japanese Application No. 2020-162864.

* cited by examiner

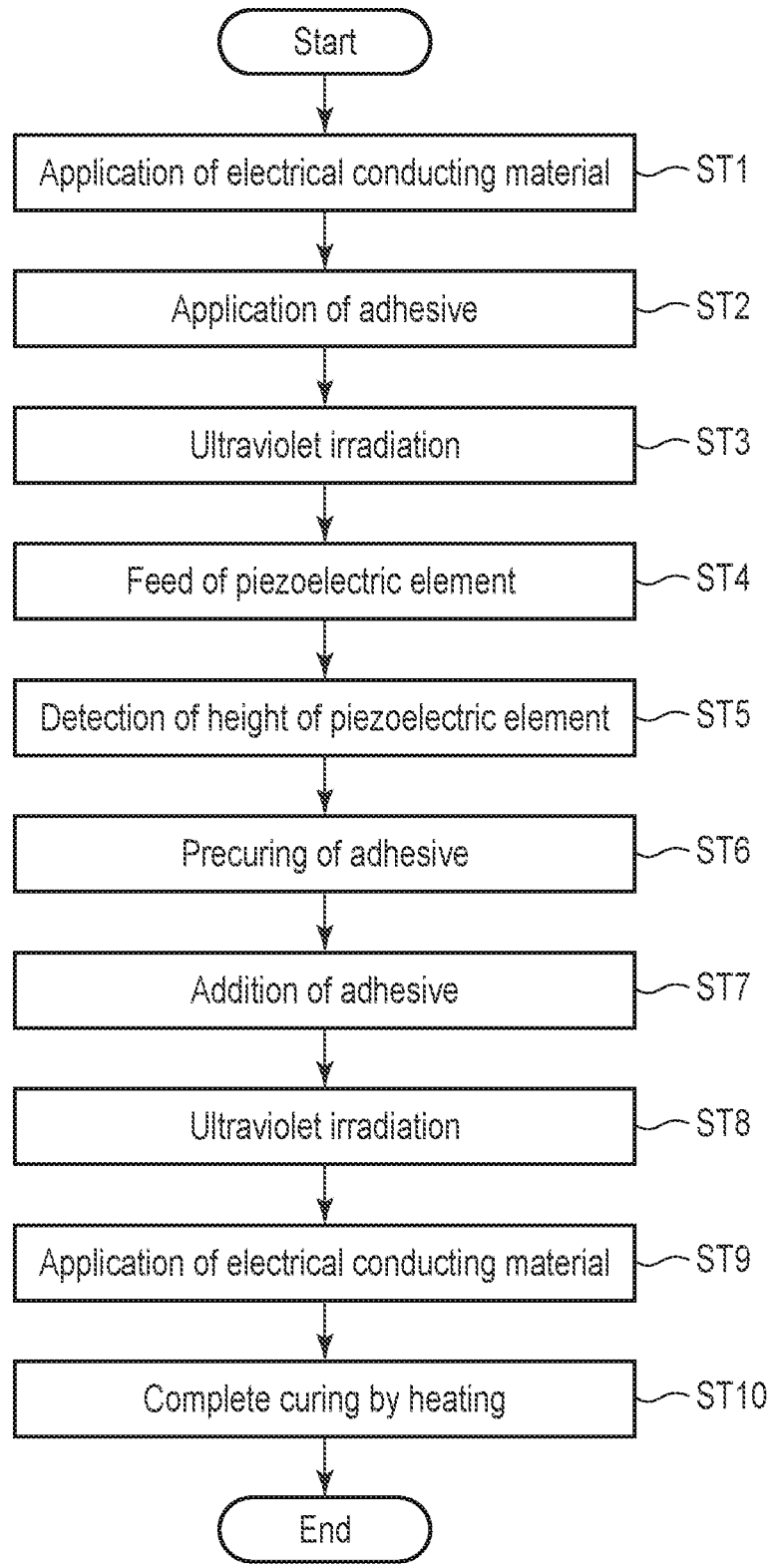
F I G. 5

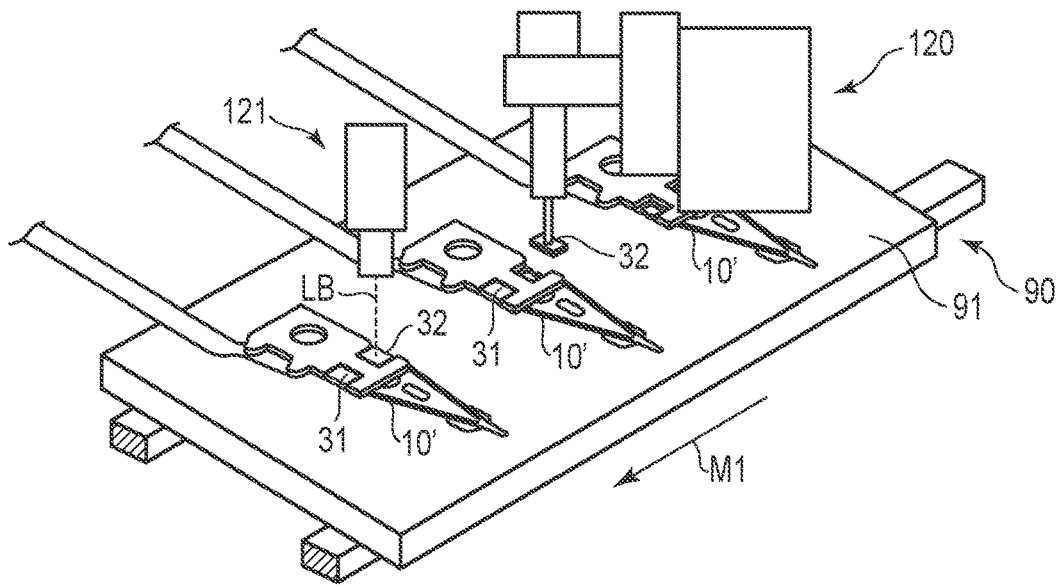
F I G. 9
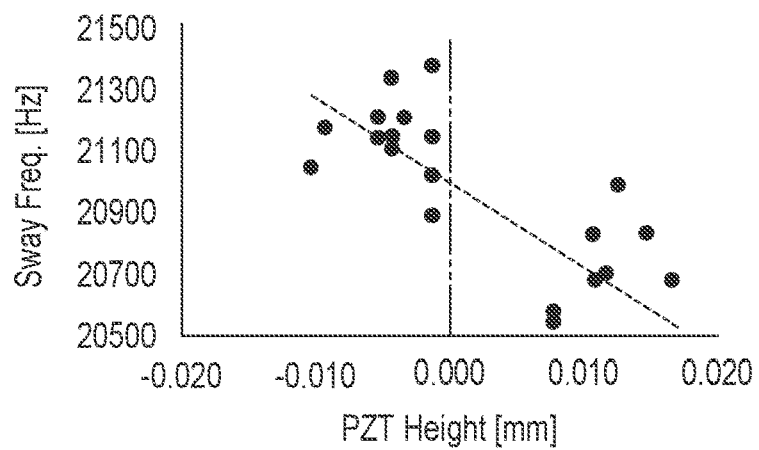
F I G. 10
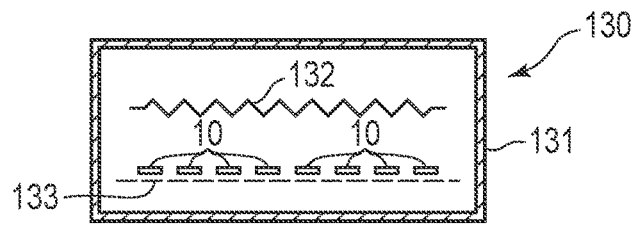
F I G. 11

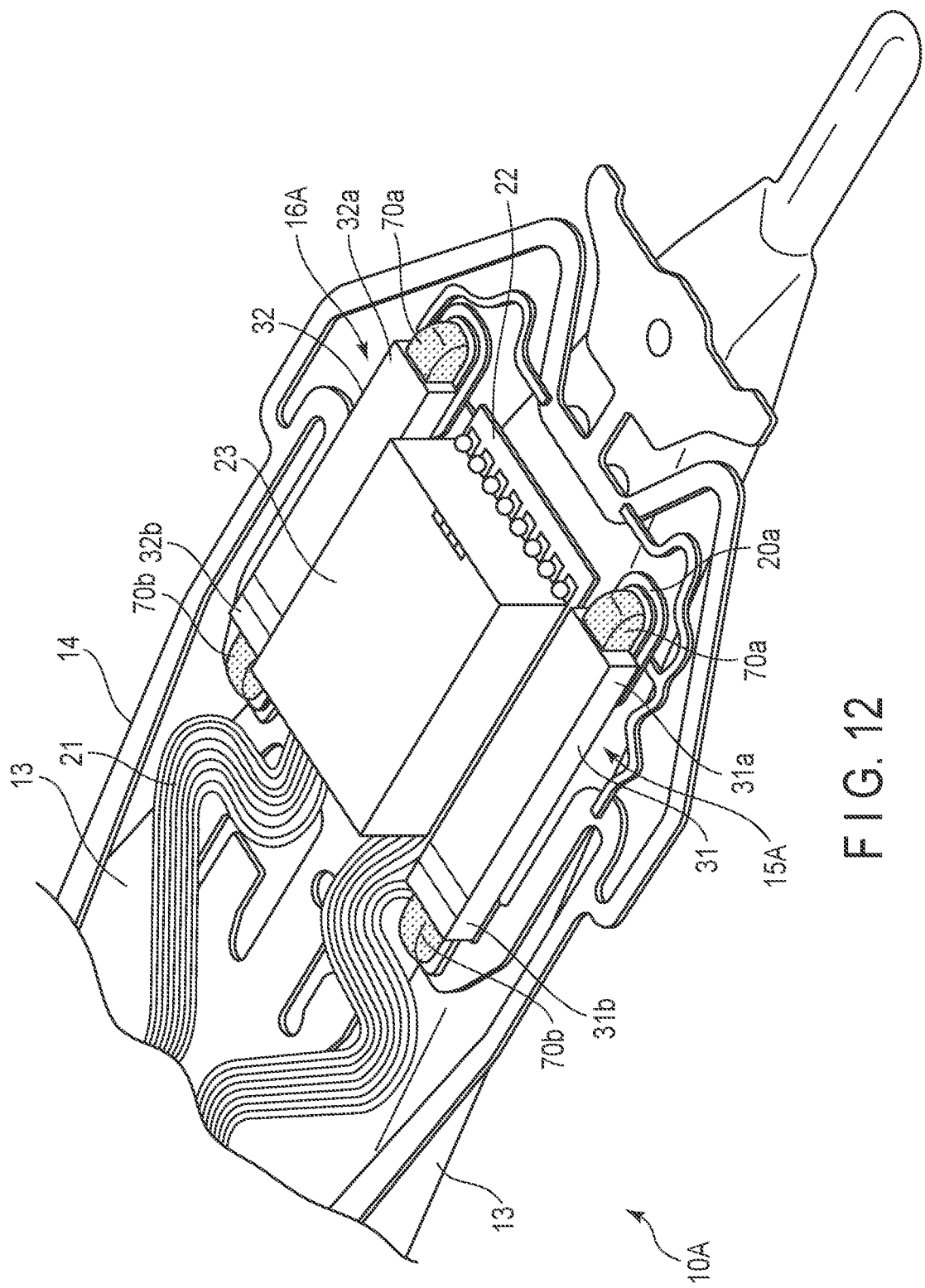
F I G. 12

MANUFACTURING METHOD OF DISK-DRIVE SUSPENSION AND MANUFACTURING APPARATUS OF DISK-DRIVE SUSPENSION

CROSS-REFERENCE TO RELATED APPLICATIONS

This application is based upon and claims the benefit of priority from prior Japanese Patent Application No. 2020-162864, filed Sep. 29, 2020, the entire contents of which are incorporated herein by reference.

BACKGROUND OF THE INVENTION

1. Field of the Invention

The present invention relates to a manufacturing method of a disk-drive suspension including piezoelectric elements and manufacturing apparatus of the disk-drive suspension.

2. Description of the Related Art

A disk drive is used in an information processing device such as a personal computer or the like. The disk drive includes magnetic disks rotating around a spindle and carriage or the like turning around a pivot shaft. A disk-drive suspension is provided on an arm of the carriage.

The disk-drive suspension includes a base plate, load beam, and flexure arranged along the load beam, and the like. A slider is provided on a gimbal portion formed in the vicinity of a tip of the flexure. Elements configured to make access to the disk such as read of data recorded on the disk and write of data to the disk, and the like are provided in the slider.

In order to cope with recording density enhancement, it is necessary to make it possible to position the magnetic head to the recording surface of the disk with a higher degree of accuracy. In JP 2002-50140 A (Patent Literature 1) and JP 2011-216160 A (Patent Literature 2), a suspension including a piezoelectric element functioning as an actuator is described.

The piezoelectric element is arranged on an actuator mounting portion of the suspension. When the piezoelectric element is to be fixed to the actuator mounting portion by means of an adhesive, the adhesive is applied to the actuator mounting portion. Then, the piezoelectric element is placed on the uncured adhesive. Thereafter, the suspension is fed to a heating device, whereby the adhesive is heated. The heated adhesive is cured, whereby the piezoelectric element is fixed to the actuator mounting portion.

In the production line of the suspension, the piezoelectric element placed on the uncured adhesive is moved in some cases. When the piezoelectric element is shifted from the predetermined position, the piezoelectric element configured to function as an actuator becomes unable to exert the predetermined performance. Further, the expertise that when the height of the piezoelectric element varies, the resonance characteristics in the sway mode or yaw mode are adversely affected depending on the type of the suspension is obtained.

In JP 2017-191914 A (Patent Literature 3), a manufacturing apparatus of an electronic device including a piezoelectric element is described. In the electronic device manufacturing apparatus of Patent Literature 3, an adhesive is applied to the actuator mounting portion. A piezoelectric element is arranged on the applied adhesive. Thereafter, a high-temperature gas is blown thereon by means of a heater, whereby the adhesive is precured. However, in that case, the fact that before the adhesive is precured, the piezoelectric element is moved by the surface tension of the adhesive, vibration, and the like has become a problem.

The present invention provides a manufacturing method and manufacturing apparatus of a disk-drive suspension capable of preventing the position of a piezoelectric element arranged on an actuator mounting portion from being shifted.

BRIEF SUMMARY OF THE INVENTION

In one embodiment, a manufacturing method of a disk-drive suspension including actuator mounting portions on which piezoelectric elements are to be mounted includes a step of applying an adhesive reactive to ultraviolet rays to the actuator mounting portions, step of irradiating the adhesive applied to the actuator mounting portions with ultraviolet rays to thereby increase the viscosity of the adhesive, step of arranging the piezoelectric elements on the adhesive the viscosity of which is increased, and step of heating the actuator mounting portions on which the piezoelectric elements are arranged. The adhesive is cured by the heating, whereby the piezoelectric elements are fixed to the actuator mounting portions.

According to this embodiment, it is possible to prevent the position of the piezoelectric element arranged on the actuator mounting portion of the disk-drive suspension from being shifted, and accurately fix the piezoelectric element to the predetermined position with the adhesive.

In the manufacturing method of the embodiment, a thermosetting electrical conducting material is applied to a portion between an electrode of each of the piezoelectric elements and conductor of each of the actuator mounting portions, and the adhesive and electrical conducting material are simultaneously heated, whereby the adhesive and electrical conducting material may be cured.

After the piezoelectric elements are arranged on the actuator mounting portions, an additional adhesive may be applied to each of the actuator mounting portions, and the added adhesive may be irradiated with ultraviolet rays.

After the piezoelectric elements are arranged on the actuator mounting portions, and before the adhesive is cured by the heating, the vicinity of a surface of the adhesive may be cured by blowing a high-temperature gas on the adhesive. Heights of the piezoelectric elements arranged on the actuator mounting portions may be detected, and an irradiation amount of the ultraviolet rays may be adjusted according to the detected heights of the piezoelectric elements.

A manufacturing apparatus according to the one embodiment includes a transport shuttle, drive mechanism, adhesive feeding device, light-irradiation device, element feeding device, and heating device. The transport shuttle holds thereon suspensions each of which includes actuator mounting portions. The drive mechanism moves the transport shuttle. The adhesive feeding device applies an adhesive reactive to ultraviolet rays to the actuator mounting portions. The light-irradiation device irradiates the applied adhesive with ultraviolet rays to thereby increase the viscosity of the adhesive. The element feeding device arranges the piezoelectric elements on the adhesive the viscosity of which is increased. The heating device heats the actuator mounting portions on which the piezoelectric elements are arranged to thereby cure the adhesive.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 5 is a flowchart showing a manufacturing process of the disk-drive suspension shown in FIG. 1.

FIG. 9 is a perspective view schematically showing the transport shuttle, element feeding device, and height detector.

FIG. 10 is a view showing a relationship between the height of the piezoelectric element and sway frequency.

FIG. 11 is a cross-sectional view schematically showing a heating device.

FIG. 12 is a perspective view of a part of a disk-drive suspension including actuator mounting portions according to a second embodiment.

DETAILED DESCRIPTION OF THE INVENTION

Hereinafter, a disk-drive suspension according to a first embodiment, manufacturing method and manufacturing apparatus thereof will be described with reference to FIGS. 1 to 11.

Figure 1:
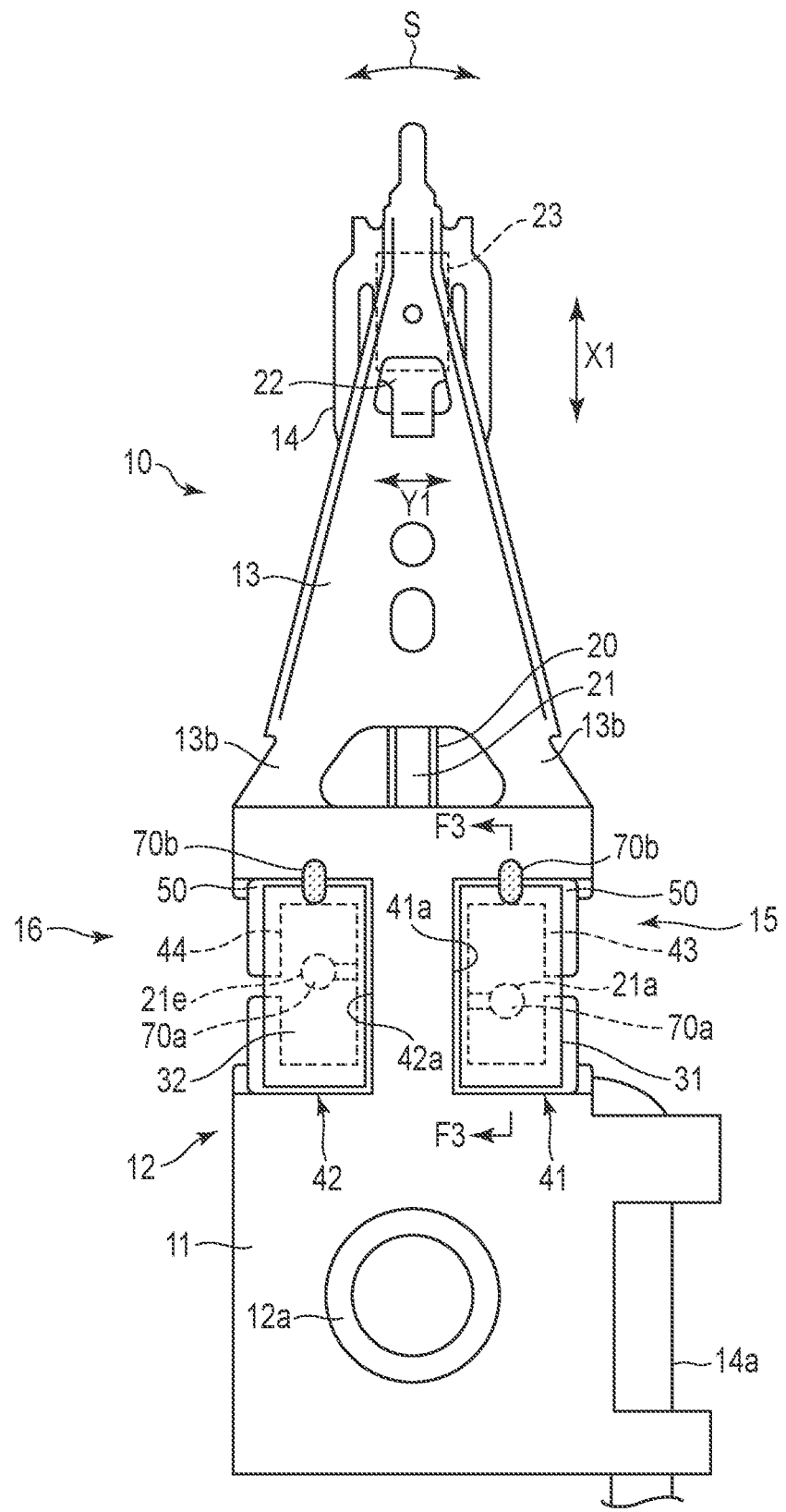
FIG. 1 is a plan view of a disk-drive suspension including actuator mounting portions according to a first embodiment.

FIG. 1 shows a disk-drive suspension 10 (in this specification, simply called a suspension 10 in some cases) according to the embodiment.

Figure 2:
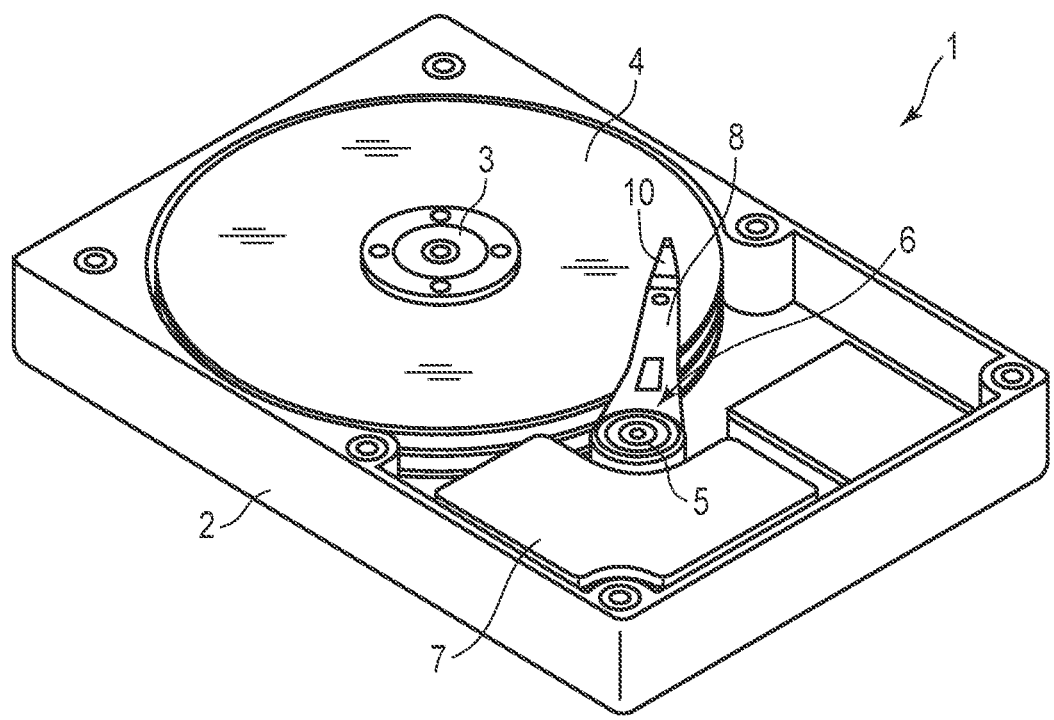
FIG. 2 is a perspective view showing an example of a disk drive.

FIG. 2 is a perspective view showing an example of a disk drive 1 including the suspension 10. The disk drive 1 includes a case 2, disks 4 rotating around a spindle 3, carriage 6 turning around a pivot shaft 5, positioning motor 7 configured to turn the carriage 6, and the like. The case 2 is tightly covered with a lid not shown. The suspension 10 is attached to an arm 8 of the carriage 6.

The suspension 10 shown in FIG. 1 includes a base portion 12 including a baseplate 11, load beam 13 constituted of a stainless steel plate, flexure 14, and a pair of actuator mounting portions 15 and 16. A boss portion 12a to be fixed to the arm 8 of the carriage 6 is formed on the base portion 12.

Figure 3:
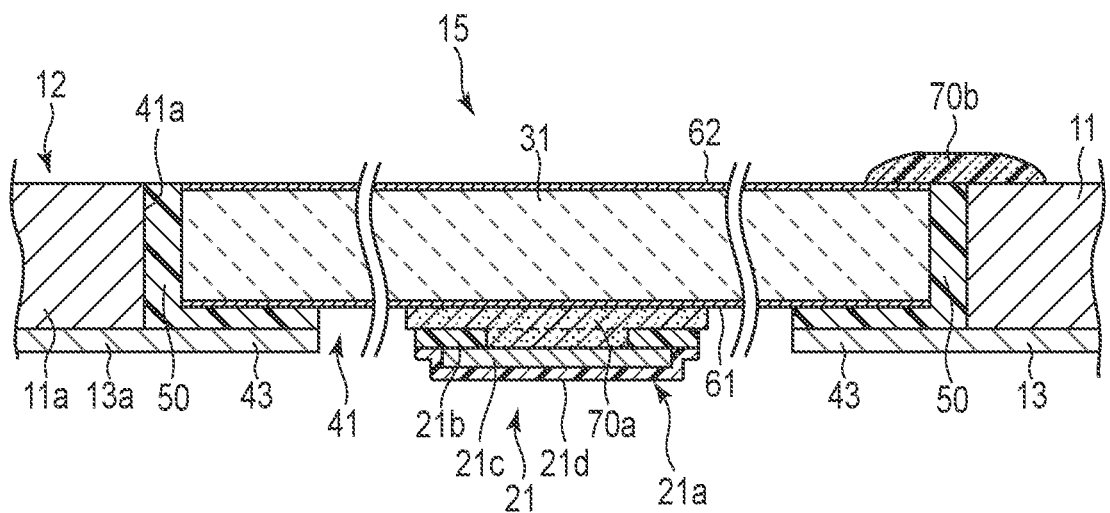
FIG. 3 is a cross-sectional view of the actuator mounting portion along line F3-F3 in FIG. 1.

A basal portion 13a (a part thereof is shown in FIG. 3) of the load beam 13 overlaps the baseplate 11. In the vicinity of the basal portion 13a of the load beam 13, hinge portions 13b which can springy be bent in the thickness direction are formed. The direction indicated by a double arrow X1 in FIG. 1 is the longitudinal direction of the suspension 10. The direction indicated by a double arrow Y1 in FIG. 1 is the width direction of the suspension 10.

The flexure 14 extends in the longitudinal direction of the suspension 10 along the load beam 13. The flexure 14 includes a metal base 20 and wiring portion 21 (a part thereof is shown in FIG. 1). The metal base 20 is constituted of a stainless steel plate having a less thickness than the load beam 13. The wiring portion 21 is formed along the metal base 20.

A tongue 22 functioning as a gimbal portion is formed in the vicinity of a tip of the flexure 14. A slider 23 constituting a magnetic head is arranged on the tongue 22. A first element and second element are provided in the slider 23. The first element magnetically records data on the disk 4 (shown in FIG. 2). The second element has a function of reading the data recorded on the disk 4. The rear part (flexure tail 14a) of the flexure 14 extends toward the rear part of the base portion 12.

A pair of actuator mounting portions 15 and 16 is provided on the base portion 12 of the suspension 10. In FIG. 1, the first actuator mounting portion 15 is arranged on the right side of the base portion 12. In FIG. 1, the second actuator mounting portion 16 is arranged on the left side of the base portion 12.

Each of piezoelectric elements 31 and 32 functioning as actuators is arranged on each of the actuator mounting portions 15 and 16. The piezoelectric elements 31 and 32 are constituted of a piezoelectric body such as lead zirconate titanate (PZT) or the like. Each of the piezoelectric elements 31 and 32 has a function of moving the tip side portion of the suspension 10 by an infinitesimal amount. The piezoelectric elements 31 and 32 expand and contract according to the voltage applied to the piezoelectric elements 31 and 32. Thereby, it is possible to move the tip side portion of the suspension 10 in the sway direction (indicated by a double arrow S in FIG. 1).

Figure 4:
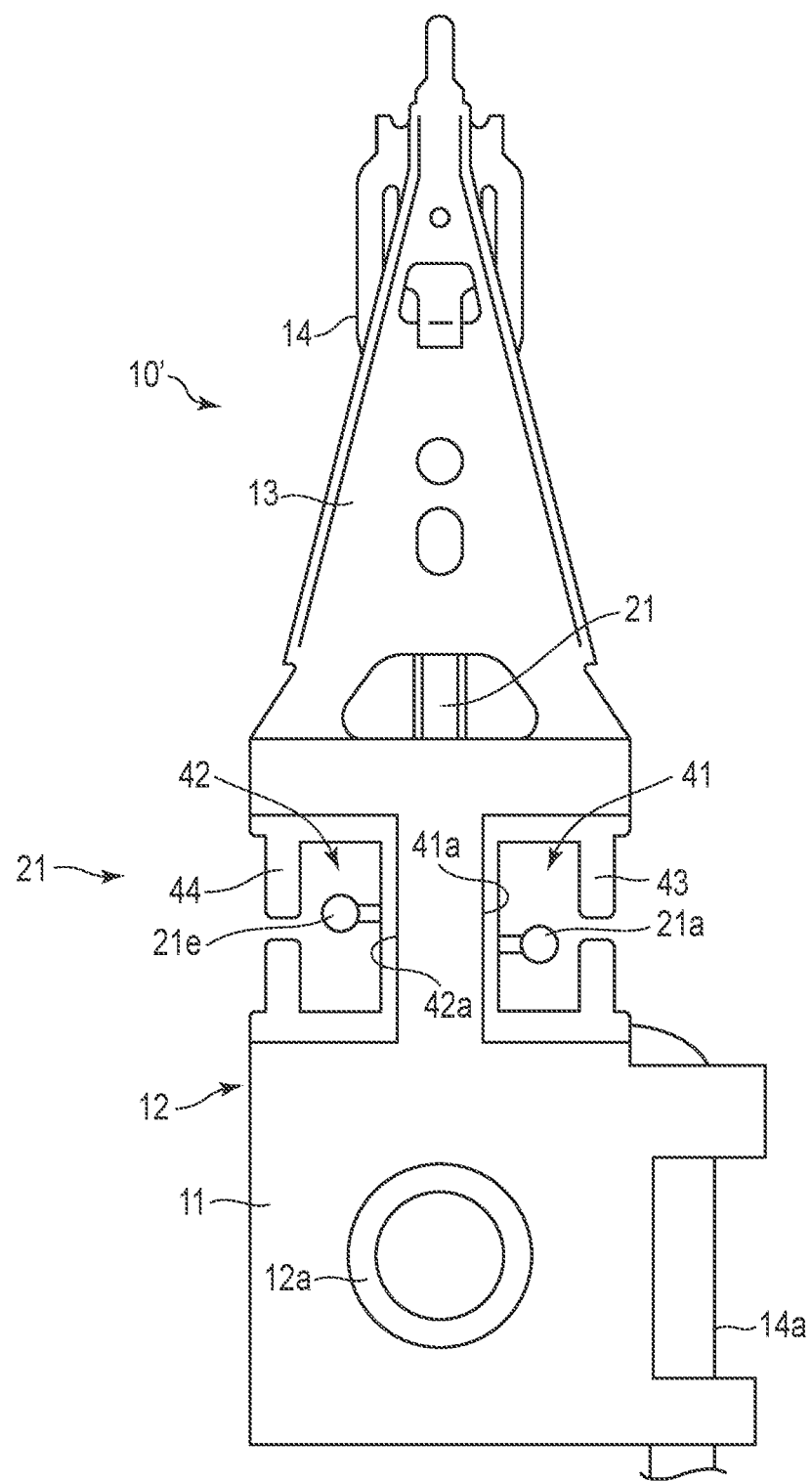
FIG. 4 is a plan view of the work before piezoelectric elements are arranged on the disk-drive suspension shown in FIG. 1.
Figure 6:
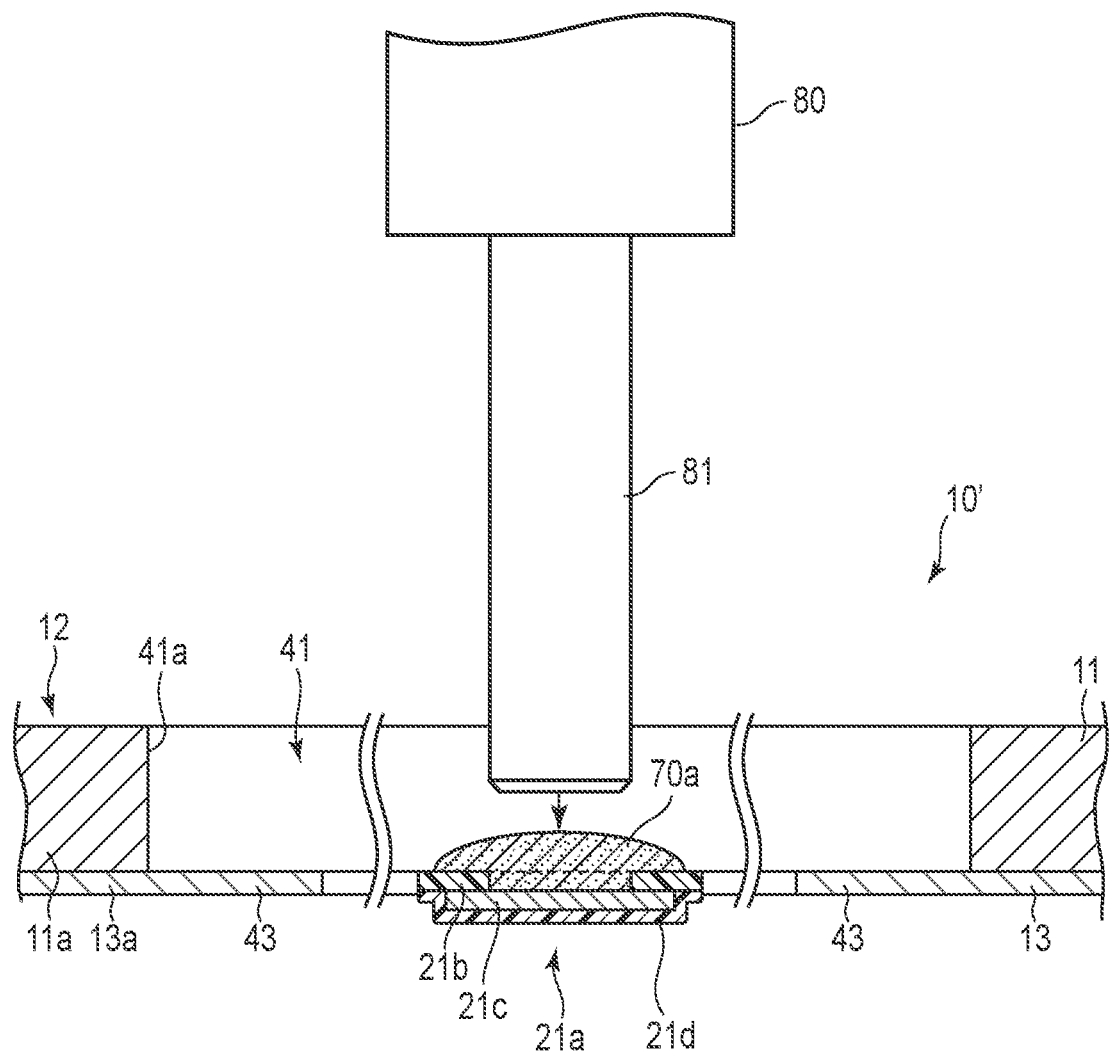
FIG. 6 is a cross-sectional view schematically showing a part of the actuator mounting portion and a part of an electrical conducting material feeding device.

FIG. 3 is a cross-sectional view showing the first actuator mounting portion 15. The second actuator mounting portion 16 is configured in the same manner as the first actuator mounting portion 15. FIG. 4 shows the suspension (called work 10') before the piezoelectric elements 31 and 32 are arranged thereon. A first opening portion 41 and second opening portion 42 are formed in the base portion 12 of the work 10'. The first piezoelectric element 31 is arranged on the first opening portion 41. The second piezoelectric element 32 is arranged on the second opening portion 42.

As shown in FIG. 4, a first supporting portion 43 is formed on the inner side of the first opening portion 41. The first supporting portion 43 is constituted of a part (basal portion 13a) of the load beam 13. A second supporting portion 44 is formed on the inner side of the second opening portion 42. The second supporting portion 44 is also constituted of a part (basal portion 13a) of the load beam 13. The first piezoelectric element 31 is fixed to an inner face 41a of the first opening portion 41 and first supporting portion 43 with an adhesive 50 (shown in FIG. 1 and FIG. 3).

The second piezoelectric element 32 is fixed to an inner face 42a of the second opening portion 42 and second supporting portion 44 with the adhesive 50. The adhesive 50 has electrical insulating properties. An example of the adhesive 50 is constituted of an ultraviolet-sensitive photo-curable epoxide-based resin. This adhesive 50 has a property that the viscosity thereof changes according to the energy of the irradiated ultraviolet rays. That is, when the energy of the irradiated ultraviolet rays is relatively low, the viscosity of the adhesive 50 increases and, when the energy of the ultraviolet rays is high, the adhesive 50 cures. Moreover, the adhesive 50 has also a property that the adhesive 50 is cured by heating. When a warm current of air is blown on the adhesive 50, the surface of the adhesive 50 dries and cures earlier than the inside of the adhesive 50.

The first actuator mounting portion 15 and second actuator mounting portion 16 are configured substantially identical to each other. Accordingly, hereinafter, descriptions will be given by using the first actuator mounting portion 15 shown in FIG. 3 as a representative.

As shown in FIG. 3, a first electrode 61 is provided on one surface of the piezoelectric element 31 in the thickness direction. A second electrode 62 is provided on the other surface of the piezoelectric element 31. The first electrode 61 is connected to a terminal 21a of the wiring portion 21 through an electrical conducting material 70a. The wiring portion 21 includes an insulating layer 21b, conductor 21c, and cover layer 21d.

The second electrode 62 (shown in FIG. 3) of the piezoelectric element 31 is electrically continuous with the baseplate 11 through an electrical conducting material 70b. The baseplate 11 functions also as a conductor on the ground side. The electrical conducting materials 70a and 70b are constituted of electrically conducting adhesives identical to each other. Each of the electrical conducting materials 70a and 70b includes a binder constituted of, for example, a thermosetting organic resin, and conducting particles mixed in the binder.

Hereinafter, the process for respectively implementing the piezoelectric elements 31 and 32 on the actuator mounting portions 15 and 16 will be described with reference to FIGS. 5 to 11.

FIG. 5 is a flowchart showing a manufacturing process of the suspension 10. By undergoing a series of steps ST1 to ST10, the piezoelectric elements 31 and 32 are implemented on the actuator mounting portions 15 and 16.

(1) Step ST1 (Step of Applying the Electrical Conducting Material 70a)

In step ST1, the uncured electrical conducting material 70a is applied to the terminal 21a of the wiring portion 21. As shown in, for example, FIG. 6, the paste-like electrical conducting material 70a is applied to the conductor 21c of the terminal 21a by a nozzle 81 of an electrical conducting material feeding device 80. As the electrical conducting material 70a, a thermosetting adhesive unreactive to ultraviolet rays is used in order that the electrical conducting material 70a may not be cured even when the material 70a is irradiated with ultraviolet rays.

Figure 7:
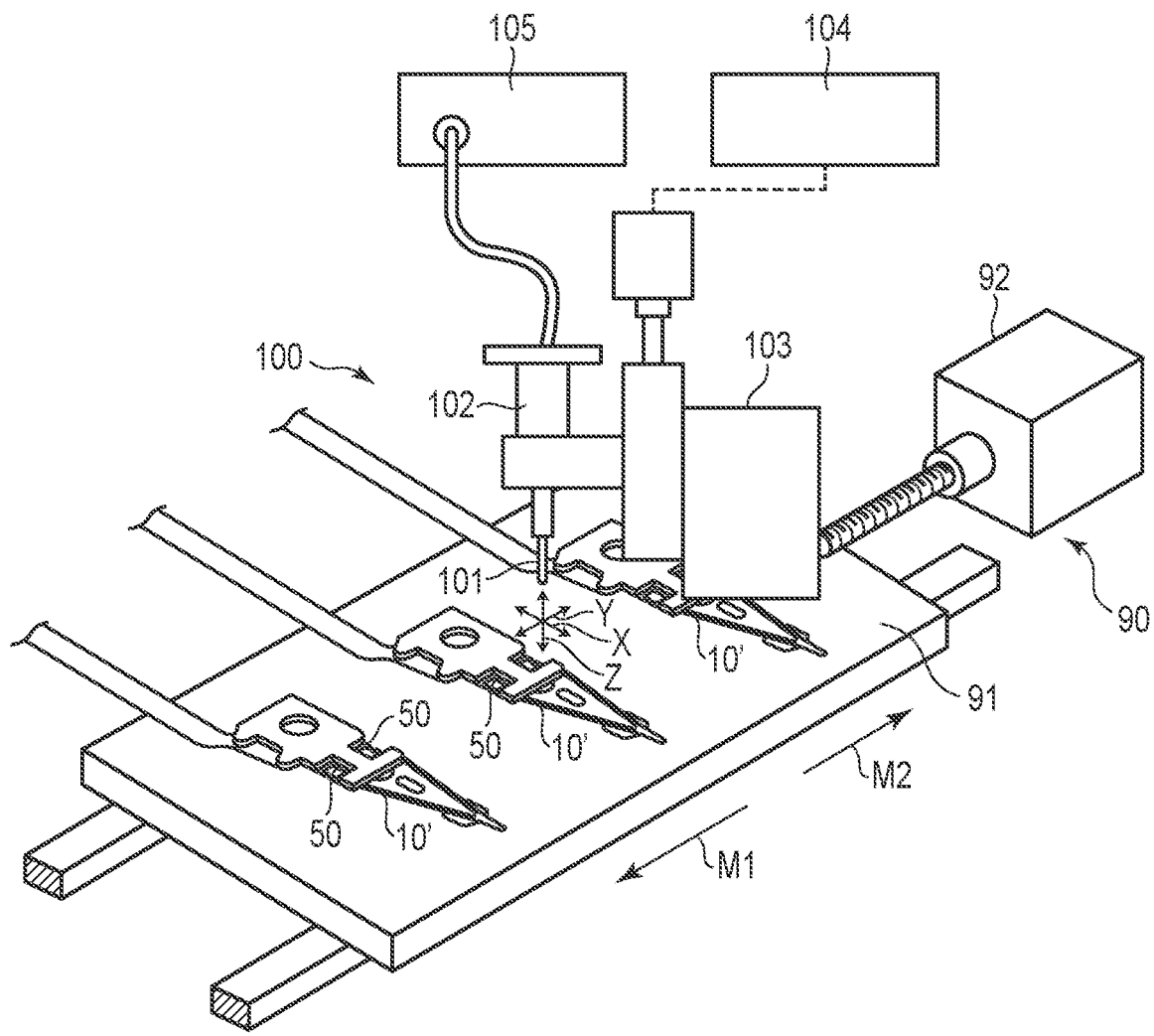
FIG. 7 is a perspective view schematically showing a transport shuttle and adhesive feeding device.

The work 10' is conveyed by a transport mechanism 90 shown in FIG. 7. The transport mechanism 90 includes a transport shuttle 91 and drive mechanism 92. The transport shuttle 91 holds thereon a plurality of pieces of work 10' at predetermined intervals. The drive mechanism 92 moves the transport shuttle 91 in the direction indicated by an arrow M1 by a predetermined pitch (spacing). The drive mechanism 92 can also move back the transport shuttle 91 in the direction indicated by an arrow M2. The transport shuttle 91 and drive mechanism 92 constitute a means for moving the plurality of pieces of work 10' by a predetermined pitch in the constant direction.

(2) Step ST2 (Step of Applying the Adhesive)

In step ST2, the adhesive 50 is applied to the actuator mounting portions 15 and 16. An adhesive feeding device 100 shown in FIG. 7 includes a dispenser 102 including a nozzle 101, moving mechanism 103, controller 104, supply source 105 of the adhesive, and the like. The moving mechanism 103 moves the dispenser 102 in the three-dimensional directions (indicated by arrows X, Y, and Z). The controller 104 controls the position of the nozzle 101. The liquid adhesive 50 discharged from the nozzle 101 is applied to the supporting portions 43 and 44, and the like of the actuator mounting portions 15 and 16.

(3) Step ST3 (Step of Ultraviolet Irradiation)

Figure 8:
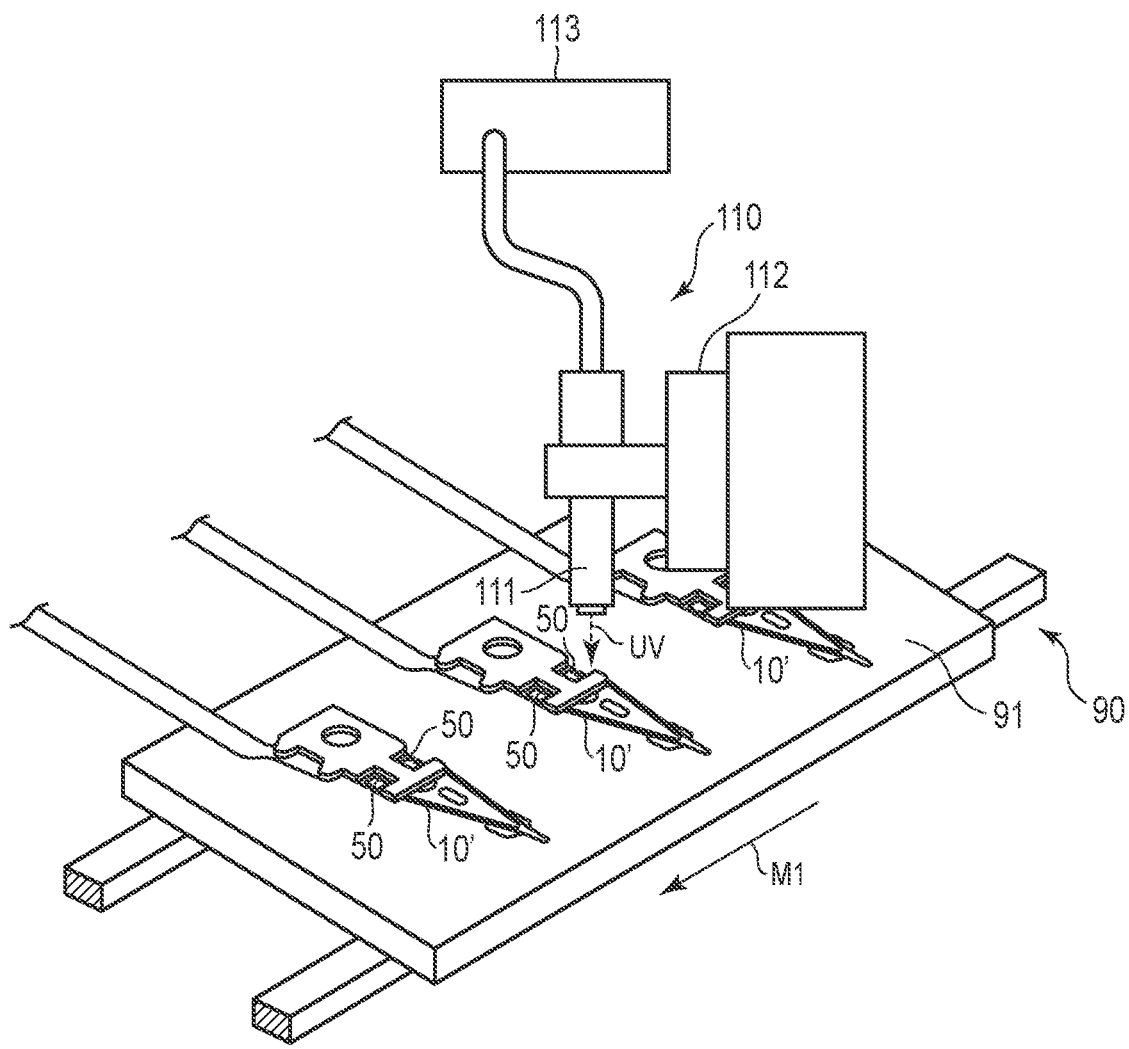
FIG. 8 is a perspective view schematically showing the transport shuttle and light-irradiation device.

In step ST3, the uncured adhesive 50 applied in step ST2 is irradiated with ultraviolet rays by a light-irradiation device 110 (shown in FIG. 8). Irradiation of the ultraviolet rays is carried out when three to ten seconds have elapsed from the application of the adhesive 50 and after the adhesive 50 wets and spreads.

The light-irradiation device 110 shown in FIG. 8 includes an irradiation head 111, holder 112, control unit 113, and the like. The irradiation head 111 radiates ultraviolet rays UV toward the actuator mounting portions 15 and 16. The holder 112 supports the irradiation head 111 thereon. The control unit 113 controls the ultraviolet rays. The uncured adhesive 50 is irradiated with the ultraviolet rays, whereby the viscosity of the adhesive 50 is increased. That is, thickening of the adhesive is carried out in step ST3.

(4) Step ST4 (Step of Placing Piezoelectric Elements)

FIG. 9 schematically shows an element feeding device 120 and height detector 121. The element feeding device 120 places the piezoelectric elements 31 and 32 respectively on the actuator mounting portions 15 and 16. The height detector 121 detects the heights of the piezoelectric elements 31 and 32.

The piezoelectric elements 31 and 32 are respectively placed on the adhesive 50 of the actuator mounting portions 15 and 16 by the element feeding device 120. At this time, the adhesive 50 has already been brought into the viscosity-increased state in advance by the step ST3. Accordingly, the piezoelectric elements 31 and 32 placed on the adhesive 50 are prevented from being moved from the predetermined positions by the surface tension of the adhesive 50 or vibration or the like of the transport shuttle 91. Further, the viscosity of the adhesive 50 is increased, and hence each of the piezoelectric elements 31 and 32 is prevented from being excessively downwardly moved by the self-weight thereof.

In step ST4, the first piezoelectric element 31 is arranged on the actuator mounting portion 15. Then, the electrode 61 on the undersurface of the first piezoelectric element 31 and conductor 21c of the terminal 21a come into contact with each other through the uncured electrical conducting material 70a. Further, the second piezoelectric element 32 is arranged on the actuator mounting portion 16. Then, the electrode on the undersurface of the second piezoelectric element 32 and conductor of the terminal 21e come into contact with each other through the uncured electrical conducting material 70a.

(5) Step ST5 (Step of Detecting the Height of the Piezoelectric Element)

In step ST5, the height of each of the piezoelectric elements 31 and 32 is detected by the detector 121 (shown in FIG. 9). The height detector 121 radiates, for example, laser light LB toward the surfaces of the piezoelectric elements 31 and 32. By receiving laser light reflected from the surfaces of the piezoelectric elements 31 and 32, the detector 121 detects the heights of the piezoelectric elements 31 and 32.

The uncured adhesive 50 has, even if the viscosity thereof is increased, a certain degree of fluidity. For this reason, when the piezoelectric elements 31 and 32 are placed on the adhesive 50, the piezoelectric elements 31 and 32 are apt to downwardly move by their own weights. Accordingly, the less the viscosity of the adhesive 50, the lower the heights of the piezoelectric elements 31 and 32 become (the heights become less).

FIG. 10 shows a relationship between the height of each of the piezoelectric elements 31 and 32 placed on the actuator mounting portions 15 and 16 and sway frequency. The axis of abscissas of FIG. 10 indicates the height of the piezoelectric element. The zero position on the axis of abscissas is the reference height (target value) of the piezoelectric element. The axis of ordinate of FIG. 10 indicates the resonance frequency in the sway direction. When the height of the piezoelectric element is excessively large or is excessively small, the peak frequency in the sway direction varies. That is, when the height of the piezoelectric element does not fall within an allowable range, it is not desirable as the characteristics of the suspension.

In step ST5, the heights of the piezoelectric elements 31 and 32 are detected. The detected heights of the piezoelectric elements 31 and 32 are compared with the reference value, and the comparison results are fed back to the control unit 113 of the light-irradiation device 110. When the detected height is greater than a first threshold, the amount of ultraviolet rays with which the adhesive 50 of the subsequent work 10' is irradiated is reduced. When the detected height is less than a second threshold, the amount of ultraviolet rays with which the adhesive 50 of the subsequent work 10' is irradiated is increased.

(6) Step ST6 (Step of Precuring the Adhesive)

In step ST6, the adhesive 50 is precured. The term "precuring" mentioned in this specification implies curing the vicinity of the surface of the adhesive 50 to a certain degree before the adhesive 50 is completely cured (complete curing) by a heating device 130 of step ST10.

For example, by blowing a high-temperature gas (air or inert gas) on the actuator mounting portions 15 and 16, the vicinity of the surface of the adhesive 50 is cured to a certain degree. Thereby, the piezoelectric elements 31 and 32 are prevented from being moved. The high-temperature gas mentioned here implies a gas (for example an inert gas) heated to a temperature sufficient for curing the adhesive 50 within a short time. However, depending on the conditions such as the property or the like of the adhesive 50, step ST6 may be omitted.

(7) Step ST7 (Step of Applying an Additional Adhesive)

In step ST7, an additional adhesive is fed to the actuator mounting portions 15 and 16. The adhesive 50 is applied to, for example, a portion between the outer circumference of each of the piezoelectric elements 31 and 32 and inner surfaces 41a and 42a of each of the opening portions 41 and 42 as the need arises. The device configured to apply the adhesive 50 may be identical to the adhesive feeding device 100 shown in FIG. 7. However, depending on the property of the adhesive 50 or conditions in the process, it is possible to omit step ST7.

(8) Step ST8 (Step of Additional Irradiation of Ultraviolet Rays)

In step ST8, the adhesive added in step ST7 is irradiated with ultraviolet rays. The light irradiation-device to be used at this time may be identical to the light-irradiation device 110 shown in FIG. 8. By irradiating the added adhesive with ultraviolet rays, the viscosity of the adhesive is increased. By the additional adhesive, it is possible to more securely fix the piezoelectric elements 31 and 32. However, depending on the conditions in the process, step ST8 is omitted.

(9) Step ST9 (Step of Applying the Electrical Conducting Material 70b)

In step ST9, the uncured electrical conducting material 70b is applied to a portion between the electrode 62 on the top surface of the first piezoelectric element 31 and baseplate 11. The uncured electrical conducting material 70b is applied to also a portion between the electrode on the top surface of the second piezoelectric element 32 and baseplate 11.

(10) Step ST10 (Step of Completely Curing the Adhesive)

In step ST10, a plurality of suspensions 10 are carried into the heating device 130 (shown in FIG. 11). Inside the device main body 131 of the heating device 130, a source of heat such as a heater 132 or the like and supporting body 133 are arranged. The plurality of suspensions 10 placed on the supporting body 133 are heated by the heater 132. The plurality of suspensions 10 accommodated in the device main body 131 are simultaneously heated by batch processing. The heater 132 heats the suspensions 10 to a temperature appropriate to cure both the adhesive 50 and each of the electrical conducting materials 70a and 70b. It is sufficient if the heating temperature is set lower than the Curie point of the piezoelectric elements 31 and 32 and, desirably lower than half the Curie point.

In step ST10, the adhesive 50 and electrical conducting materials 70a and 70b are simultaneously heated. Thereby, the adhesive 50 is completely cured, and electrical conducting materials 70a and 70b are also cured. The term "complete curing" mentioned here implies a state where the practical fixing strength is obtained by curing not only the vicinity of the surface of the adhesive 50 but also the inside of the adhesive 50.

By undergoing the series of manufacturing steps described above, the adhesive 50 is cured, and piezoelectric elements 31 and 32 are respectively fixed to the actuator mounting portions 15 and 16. The electrical conducting material 70a is cured, whereby the state of connection between each of the piezoelectric elements 31 and 32 and each of the terminals 21a and 21e is fixed. Further, the electrical conducting material 70b is cured, whereby the state of connection between each of the piezoelectric elements 31 and 32 and baseplate 11 is fixed.

According to the manufacturing method of this embodiment, the viscosity of the adhesive 50 is increased by step ST3 (ultraviolet irradiation). Thereby, the positions of the piezoelectric elements 31 and 32 are prevented from being shifted. For example, the piezoelectric elements 31 and 32 are prevented from being moved by the vibration at the time when the work 10' is conveyed by the transport shuttle 91. In the state where the piezoelectric elements 31 and 32 are held at the predetermined positions in the manner described above, the pieces of work 10' are introduced into the heating device 130. Then, the adhesive 50 is heated by the heating device 130, whereby the adhesive 50 is completely cured. Thereby, it has been possible to precisely fix the piezoelectric elements 31 and 32 to the predetermined positions of the actuator mounting portions 15 and 16.

In this embodiment, in step ST5, the heights of the piezoelectric elements 31 and 32 are detected, and the detection results are fed back to the light-irradiation device 110, whereby the viscosity of the adhesive 50 is adjusted.

Thereby, it has been possible to make the heights of the piezoelectric elements 31 and 32 closer to the reference value, and avoid the variations in the sway vibration mode.

FIG. 12 shows a part of a suspension 10A according to a second embodiment. Regarding the suspension 10A, parts identical to the suspension 10 of the first embodiment, i.e., portions common to both the suspensions 10 and 10A are denoted by common reference symbols.

As in the case of the suspension 10 of the first embodiment, the suspension 10A according to the second embodiment includes a load beam 13 and flexure 14. A slider 23 is mounted on a tongue 22 formed on the flexure 14.

Figure 13:
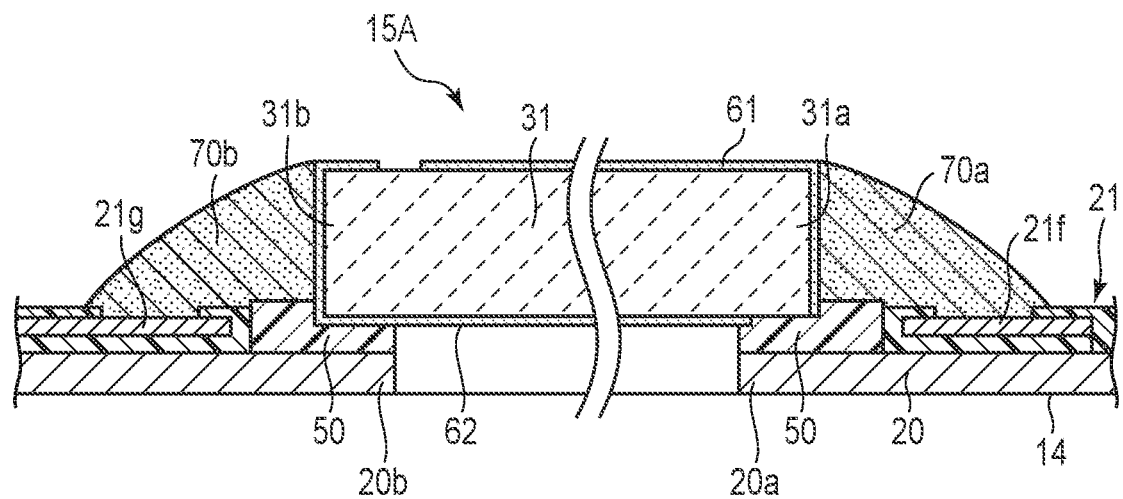
FIG. 13 is a cross-sectional view of the actuator mounting portion shown in FIG. 12.

Actuator mounting portions 15A and 16A are provided on both sides of the slider 23. A first piezoelectric element 31 is arranged on the first actuator mounting portion 15A. FIG. 13 shows the cross section of the first actuator mounting portion 15A. The second actuator mounting portion 16A (shown in FIG. 12) has the configuration substantially identical to the first actuator mounting portion 15A. Accordingly, the first actuator mounting portion 15A will be described hereinafter, and descriptions of the second actuator mounting portion 16A are omitted.

As shown in FIG. 13, one end portion 31a of the piezoelectric element 31 is fixed to a first supporting portion 20a of a metal base 20 by an adhesive 50. The other end portion 31b of the piezoelectric element 31 is fixed to a second supporting portion 20b of the metal base 20 by the adhesive 50. The adhesive 50 has electrical insulating properties. A first electrode 61 of the piezoelectric element 31 is electrically continuous with a first conductor 21f of the actuator mounting portion 15A through an electrical conducting material 70a. A second electrode 62 of the piezoelectric element 31 is electrically continuous with a second conductor 21g of the actuator mounting portion 15A through an electrical conducting material 70b.

Figure 14:
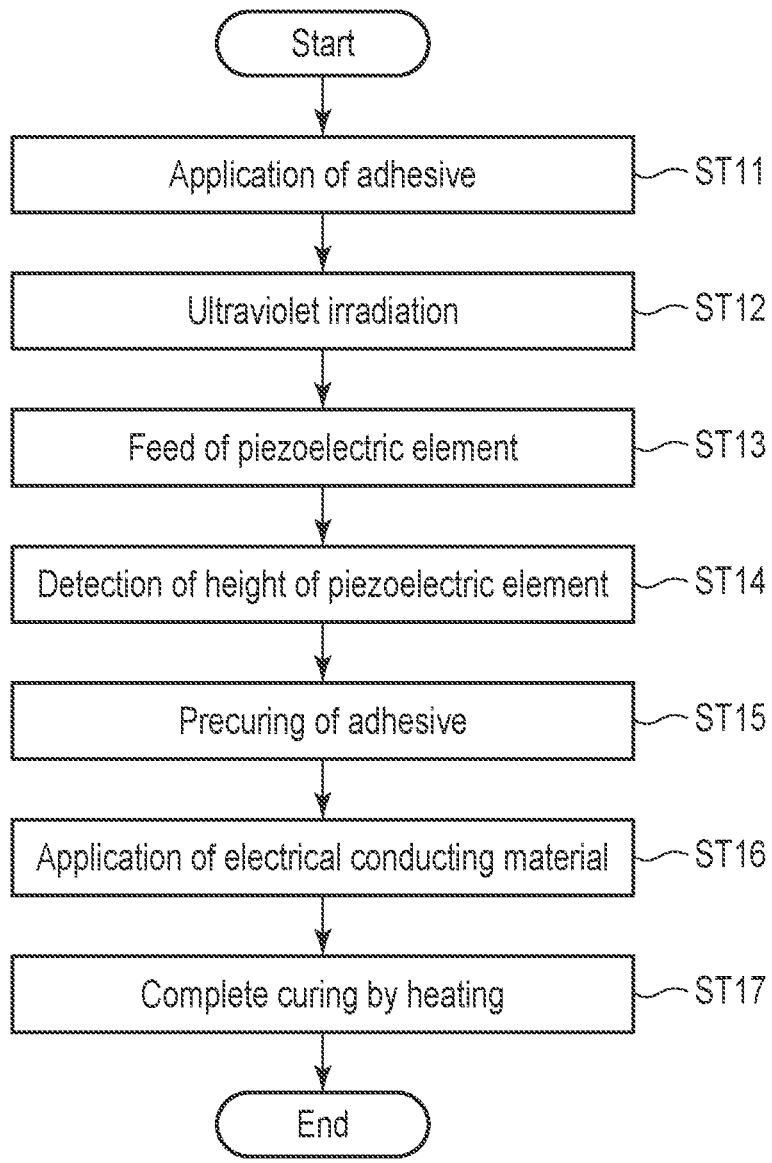
FIG. 14 is a flowchart showing a manufacturing process of the disk-drive suspension shown in FIG. 12.

FIG. 14 is a flowchart showing a manufacturing process of the suspension 10A.

In step ST11 (step of applying the adhesive), an uncured adhesive 50 is applied to the supporting portions 20a and 20b of the actuator mounting portions 15A and 16A.

In step ST12 (step of ultraviolet irradiation), by irradiating the adhesive 50 with ultraviolet rays, the viscosity of the adhesive 50 is increased.

In step ST13 (step of placing piezoelectric elements), the piezoelectric elements 31 and 32 are placed on the adhesive 50 applied to the actuator mounting portions 15A and 16A. The viscosity of the adhesive 50 is increased by step ST12. Accordingly, the piezoelectric elements 31 and 32 are prevented from being moved from the predetermined positions.

In step ST14 (step of detecting the height), the heights of the piezoelectric elements 31 and 32 are detected. The detected heights of the piezoelectric elements 31 and 32 are compared with the reference value, and the comparison results are fed back to the light-irradiation device 110 (shown in FIG. 8). When the detected height is greater than the first threshold, the amount of ultraviolet rays with which the adhesive 50 of the subsequent work is irradiated is reduced. When the detected height is less than the second threshold, the amount of ultraviolet rays with which the adhesive of the subsequent work is irradiated is increased.

In step ST15 (precuring of the adhesive), the adhesive 50 is precured. For example, by blowing a high-temperature gas on the actuator mounting portions 15A and 16A, the vicinity of the surface of the adhesive 50 is cured to a certain degree. Thereby, the piezoelectric elements 31 and 32 are prevented from being moved. However, depending on the conditions such as the property or the like of the adhesive 50, step ST15 may be omitted.

In step ST16 (step of applying the electrical conducting material), the uncured electrical conducting materials 70a and 70b are fed to the first actuator mounting portion 15A. Further, the uncured electrical conducting materials 70a and 70b are fed to the second actuator mounting portion 16A.

In step ST17 (complete curing step), a plurality of suspensions 10A are accommodated in the heating device 130 (shown in FIG. 11). These suspensions 10A are heated in the heating device 130, whereby the adhesive 50 and electrical conducting materials 70a and 70b are cured. The suspension 10A of this embodiment makes it possible to fix the piezoelectric elements 31 and 32 to the predetermined positions, whereby the suspension 10A could exhibit an effect particularly in improving the resonance characteristics in the yaw mode.

In implementing the present invention, needless to say, not only the specific aspect of the suspension, but also the specific aspect of each of the elements constituting the actuator mounting portion such as the piezoelectric element, adhesive, electrical conducting material, and the like may be variously changed and implemented. Further, the adhesive feeding device, light-irradiation device, element feeding device, and the like may also be implemented in various configurations.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of a disk-drive suspension including an actuator mounting portion on which a piezoelectric element is to be mounted, the method comprising:
    applying an adhesive reactive to ultraviolet rays to the actuator mounting portion;
    irradiating the adhesive applied to the actuator mounting portion with ultraviolet rays to thereby increase a viscosity of the adhesive;
    arranging the piezoelectric element on the adhesive the viscosity of which is increased in the irradiating;
    applying a thermosetting electrical conducting material to a portion between an electrode of the piezoelectric element and a conductor of the actuator mounting portion;
    heating the actuator mounting portion on which the piezoelectric element is arranged; and
    simultaneously curing the adhesive and the electrical conducting material by the heating to thereby fix the piezoelectric element to the actuator mounting portion.

2. The manufacturing method of claim 1, further comprising:
    applying, after the piezoelectric element is arranged on the actuator mounting portion, an additional adhesive to the actuator mounting portion; and
    irradiating the additional adhesive with ultraviolet rays to thereby increase a viscosity of the additional adhesive.

3. The manufacturing method of claim 1, further comprising blowing, after the piezoelectric element is arranged on the actuator mounting portion, and before the adhesive is cured by the heating, a high-temperature gas on the adhesive to thereby cure a vicinity of a surface of the adhesive.

4. The manufacturing method of claim 1, further comprising:
   detecting a height of the piezoelectric element arranged on the actuator mounting portion; and
   adjusting an irradiation amount of the ultraviolet rays to be used a next time the irradiating is performed, according to the detected height of the piezoelectric element.

5. A manufacturing method of a disk-drive suspension including an actuator mounting portion on which a piezoelectric element is to be mounted, the method comprising:
   applying an adhesive reactive to ultraviolet rays to the actuator mounting portion;
   irradiating the adhesive applied to the actuator mounting portion with ultraviolet rays to thereby increase a viscosity of the adhesive;
   arranging the piezoelectric element on the adhesive the viscosity of which is increased in the irradiating;
   detecting a height of the piezoelectric element arranged on the adhesive in the arranging, and adjusting an irradiation amount of the ultraviolet rays to be used a next time the irradiating is performed, according to the detected height of the piezoelectric element;
   heating the actuator mounting portion on which the piezoelectric element is arranged; and
   curing the adhesive by the heating to thereby fix the piezoelectric element to the actuator mounting portion.

* * * * *